United States Patent [19]

Kinzer

[11] Patent Number: 4,974,059
[45] Date of Patent: Nov. 27, 1990

[54] SEMICONDUCTOR HIGH-POWER MOSFET DEVICE

[75] Inventor: Daniel M. Kinzer, Riverside, Calif.

[73] Assignee: International Rectifier Corporation, El Segundo, Calif.

[21] Appl. No.: 399,345

[22] Filed: Aug. 28, 1989

Related U.S. Application Data

[63] Continuation of Ser. No. 48,991, Apr. 29, 1987, abandoned, which is a continuation of Ser. No. 451,795, Dec. 21, 1982, abandoned.

[51] Int. Cl.$^5$ .............................................. H01L 29/78
[52] U.S. Cl. ................................. 357/23.4; 357/23.8; 357/38; 357/52; 357/55
[58] Field of Search .................. 357/23.4, 23.8, 38, 357/52, 55

[56] References Cited

U.S. PATENT DOCUMENTS

| | | | |
|---|---|---|---|
| 4,070,690 | 1/1978 | Wickstrom | 357/23.4 |
| 4,072,975 | 2/1978 | Ishitani | 357/23.4 |
| 4,145,700 | 3/1979 | Jambotkar | 357/23.4 |
| 4,233,617 | 11/1980 | Klaussen et al. | 357/23.4 |
| 4,412,242 | 10/1983 | Herman et al. | 357/52 |
| 4,417,385 | 11/1983 | Temple | 357/23 VD |
| 4,561,003 | 12/1985 | Tihanyi et al. | |

FOREIGN PATENT DOCUMENTS

| | | | |
|---|---|---|---|
| 48-40814 | 12/1973 | Japan | 357/23.4 |
| 51-85381 | 7/1976 | Japan | 357/23.4 |
| 53-74385 | 7/1978 | Japan | 357/23.4 |
| 55-140262 | 11/1980 | Japan | 357/23.4 |
| 57-42164 | 3/1982 | Japan | 357/23.4 |
| 2062349/A | 10/1980 | United Kingdom | |

OTHER PUBLICATIONS

IEEE Transaction on Microwave Theory and Techniques, vol. Mtt 24, No. 6, Jun. 1976, "A Power Silicon Microwave MOS Transistor", by Oakes et al. pp. 305-311.

H. Wolf, "Semiconductors", ©1971, John Wiley, Wiley-Interscience, L. C. 77-159286, p. 315.

Tihanyi, "A Qualitative Study of the DC Performance of SIPMOS Transistors", 1980, pp. 181-189.

Pelly, "The Do's and Don'ts of using Power HEXFETs", HEXFET Data book, 1981, International Rect., pp. 6-11.

Leipold et al., "A Fet-Controlled Thyristor in SIPMOS Technologhy", IEEE 1980, pp. 79-82.

Krausse et al., "Power MOSFETS Run Directly Off TTL", Electronics, Aug. 1980, pp. 145-147.

A High Power MOSFET With a Vertical Drain Electrode and a Mested Gate Structure, Yoshida et al., IEEE Journal of Solid-State Circuits, vol. SC-11, No. 4, Aug. 1976.

Primary Examiner—William Mintel
Assistant Examiner—Steven Loke
Attorney, Agent, or Firm—Ostrolenk, Faber, Gerb & Soffen

[57] ABSTRACT

A high power MOSFET is disclosed in which a plurality of hexagonal base regions formed in the surface of a chip receive respective hexagonal annular source regions. The base regions are relatively shallow and of relatively low conductivity material. A central portion of each of the base regions reaches the upper surface of the wafer and contacts a sheet source electrode which also contacts the source regions. The central regions of the base elements which contact the source electrode are of higher conductivity than the main base portion for a distance extending just below the depth of the source regions. The base regions are formed by ion implantation through a gate oxide which is exposed by a window in an overlying polysilicon layer. After ion implantation and driving of the base regions, an annular source region is diffused into each base, employing the same polysilicon window as an outer mask. A central oxide dot may be left in the center of each of the open windows so that the oxide is thicker at the central regions and remains in place during the diffusion of the source regions.

9 Claims, 13 Drawing Sheets

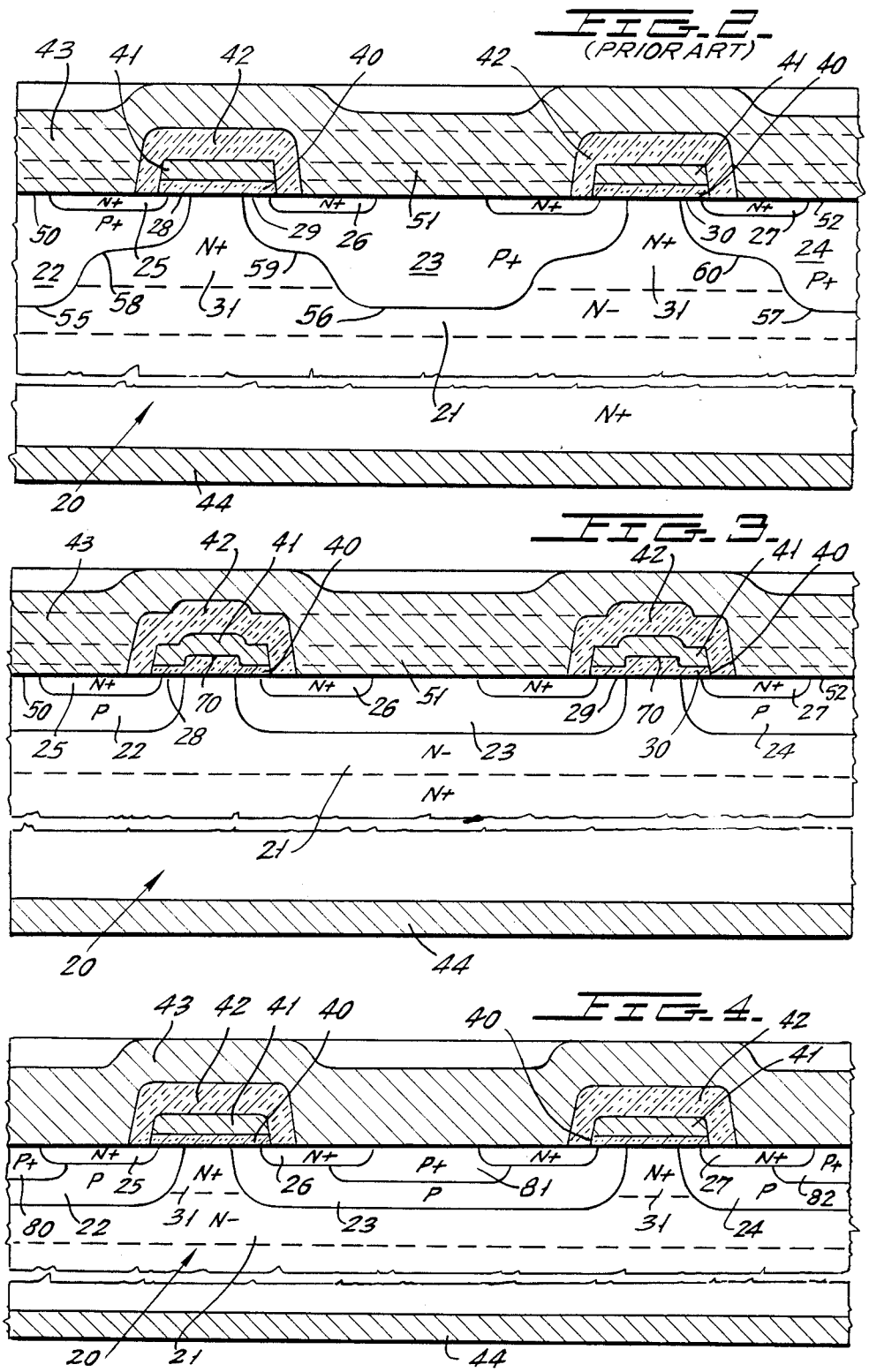

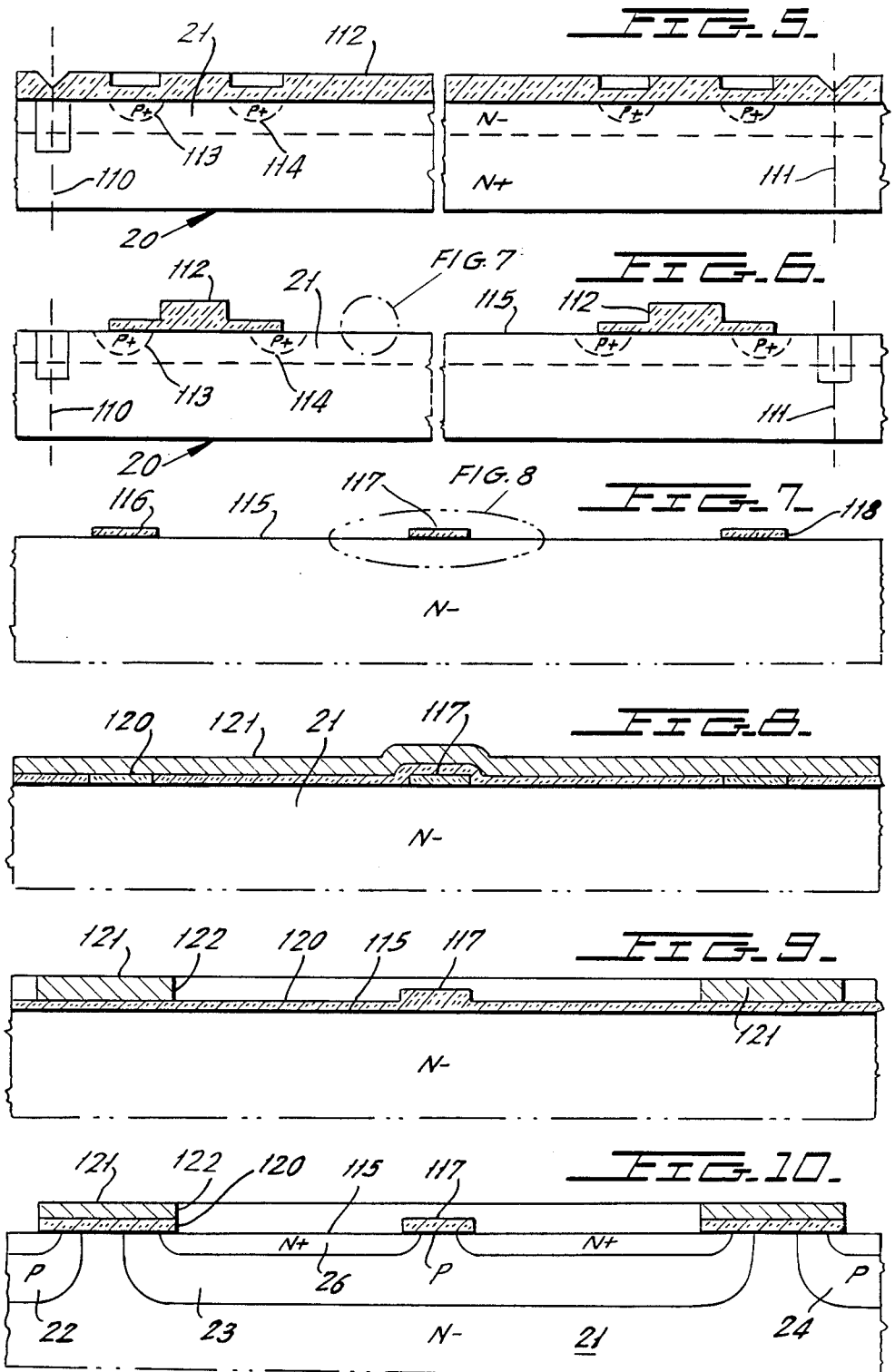

SEMICONDUCTOR HIGH-POWER MOSFET DEVICE

This is a continuation of application Ser. No. 07/048,991 filed on Apr. 29, 1987, which is a continuation of application Ser. No. 06/451,795 filed on Dec. 21, 1982, both abandoned.

RELATED APPLICATIONS

This application is related to co-pending application Ser. No. 232,713, filed Feb. 9, 1981, which is a continuation of application Ser. No. 951,310, filed Oct. 13, 1978, in the names of Alexander Lidow and Thomas Herman, entitled "HIGH POWER MOSFET WITH LOW ON-RESISTANCE AND HIGH BREAKDOWN VOLTAGE" (now abandoned); to co-pending application Ser. No. 243,544, filed Mar. 13, 1981, which is a continuation of application Ser. No. 38,662, filed May 14, 1979, in the names of Alexander Lidow, Thomas Herman and Vladimir Rumennik, entitled "PLURAL POLYGON SOURCE PATTERN FOR MOSFET" (now abandoned); to co-pending application Ser. No. 178,689, filed Aug. 18, 1980, in the names of Alexander Lidow and Thomas Herman, entitled "PROCESS FOR MANUFACTURE OF HIGH POWER MOSFET WITH LATERALLY DISTRIBUTED HIGH CARRIER DENSITY BENEATH THE GATE OXIDE"; to co-pending application Ser. No. 207,123, filed Nov. 17, 1980, in the names of Thomas Herman and Alexander Lidow, entitled "PLANAR STRUCTURE FOR HIGH VOLTAGE SEMICONDUCTOR DEVICES WITH GAPS IN GLASSY LAYER OVER HIGH FIELD REGIONS", now U.S. Pat. No. 4,414,560, issued Oct. 25, 1983; and to co-pending application Ser. No. 207,126, filed Nov. 17, 1980, in the name of Alexander Lidow, entitled "FLOATING GUARD REGION AND PROCESS OF MANUFACTURE FOR SEMICONDUCTOR SWITCHING DEVICE USING SPACED MOS TRANSISTORS HAVING A COMMON DRAIN REGION", now U.S. Pat. No. 4,414,560, issued Nov. 8, 1983, all of which are assigned to the assignee of the present invention.

BACKGROUND OF THE INVENTION

This invention relates to metal oxide semiconductor field effect transistors (MOSFETS), and more specifically relates to a novel configuration for a high power MOSFET device and a novel process for its manufacture.

High power MOSFETS having low on-resistance and relatively high breakdown voltage are known and are typically shown in any of the related applications referred to above. Thus, the device of co-pending application Ser. No. 178,689 provides a high power MOSFET device with low forward resistance and high packing density for individual cell elements which are connected in parallel to form the device. Moreover, the device can be made with D-MOS fabrication techniques and has a relatively low gate capacitance.

The individual cells of known devices have respective source regions which are polygonal, and are preferably hexagonal, to ensure a constant spacing between the major lengths of adjacent sources disposed over the surface of the chip or wafer. Each of the hexagonal regions has a width measured perpendicularly to the two opposing sides of the hexagon which they define of less than about 1 ml and are spaced from one another by about 0.6 mil when measured perpendicularly between the adjacent straight sides of adjacent polygonal regions. An extremely large number of small hexagonal source elements may be formed in the same surface of the semiconductor body for a given device. For example, 6,600 hexagonal source regions have been formed in a chip area having a dimension of about 100 by 140 mils to produce an effective channel width of about 22,000 mils. This produces a device having very high current capacity and low forward resistance.

A polysilicon gate may be used which has a hexagonal grid-like configuration which is disposed atop a corresponding gate oxide layer. Each leg of the gate oxide grid overlies two spaced channels which are capable of inversion by application of a voltage to the polysilicon gate. The gate structure is then contacted over the upper surface of the device by symmetric, elongated gate contact fingers which ensure good contact over the full surface of the gate.

Each of the polygonal source regions is contacted by a continuous conductive source contact layer or sheet which engages the individual polygonal sources through openings in an insulation layer covering the source regions. These openings can be formed by conventional D-MOS photolithographic techniques. A source pad connection region is then provided for the source conductor and a gate pad connection region is provided for the elongated gate fingers. A drain connection region is made to the reverse surface of the semiconductor device.

During conduction, current from the individual source regions flow through the surrounding respective channels into the upper web-shaped portion of the common region which extends vertically through the thickness of the chip to the bottom drain electrode. Preferably, the upper portion of this web has a high conductive in order to decrease the on-resistance of the device by reducing spreading resistance and bulk resistance. The higher conductivity also reduces the effect of the parasitic bipolar transistor formed by the three alternate conductivity regions which is inherently defined in the device. Preferably, this high conductivity common region has a constant impurity concentration laterally across the full width of the device, as is disclosed in above-noted co-pending application Ser. No. 178,689.

Each of the source elements described above is formed in its own respective channel or base region. Typically in an N channel, enhancement mode MOSFET device, the channel or base region is a P type region which extends into the surface of the chip, with a polygonal source region diffused or otherwise formed into this base region. The base region is preferably relatively highly conductive in order to prevent turning on of a parasitic bipolar transistor which is formed by the three sequential regions of the device which would inject a destructive current and energetic electrons into the gate region which reduces the ruggedness of the device. By ruggedness, is meant the ability of the device to resist damage or destruction due to energetic electrons in the gate region, both in avalanche and during forward conduction. In the center of each cell was a deeper P+ type region of about 5 microns as compared to a 3 micron depth for the outer periphery of the bottom of the base regions. This deeper and more highly conductive P+ region served to increase the conductance of, and reduce the contact resistance to, the base region of the parasitic bipolar transistor.

The use of the increased depth region in the base, however, complicates the manufacturing process because it requires a separate mask during the manufacturing process, and adequate area to allow for side-diffusion of the deep P+ section. The additional mask imposes a limitation on the maximum reduction of cell size for a given set of tolerances, since cell size must be increased to accommodate manufacturing tolerances for each additional mask which is used in the process of forming the cell. Thus, when using the additional mask to form the central deeper section of the P+ base region, the minimum cell size which could be obtained was about 38 microns in lateral dimension.

BRIEF DESCRIPTION OF THE INVENTION

In accordance with the present invention, the increased depth section at the bottom of each of the base cells is eliminated and the entire base is made of a relatively shallow geometry having a depth, preferably of about 3 microns and in the range of 1.0 micron to 6.0 microns.

The presence of a deeper section causes a decrease in the breakdown voltage of the device. Thus, the removal of the deep section of the base causes an increase in breakdown voltage for particular devices from about 440 volts to about 490 volts and generally permits an improvement of about 15% in all ratings. The novel base configuration therefore permits the use of a thinner epitaxial layer with a lower resistivity to achieve the same breakdown voltage. This means that for a specified breakdown voltage, the onstate resistance can be substantially reduced using this technique.

The ruggedness of the device can be improved over a device with an increased depth section by forming a small P+ region in the surface of the center of the base which extends from the wafer surface to below and slightly under the adjacent surrounding source region. It has been found that this geometry substantially improves the ruggedness of the device and also reduces the contact resistance between the source electrode and the base region, in some cases by an order of magnitude or more.

The elimination of the central increased depth region of the base eliminates a mask during the manufacture of the cells, so that cell size can be reduced. Thus, cell size was reduced from about 38 microns to about 26 microns. This allows about twice as many cells in a given area, thereby substantially increasing the packing density of cells within a given chip area and substantially increasing the channel width. For example, channel width was increased by about 25% within a given chip area.

The elimination of the central increased depth region of the base also permits the use of a novel manufacturing process for forming the base and source regions. Thus, in accordance with the invention, the wafer or chip surface is processed such that a thin gate oxide is deposited on the full surface of the chip. A polysilicon layer, which is subsequently processed to define the polysilicon gate, is then applied over the oxide layer. The polysilicon layer has polygonal openings or windows formed therein to expose the upper surface of the underlying gate oxide. Preferably, the gate oxide at the center of each of the windows exposed through the polysilicon has an increased thickness caused either by a previously formed or subsequently formed oxide dot.

Thereafter, the surface is exposed to an ion beam of ions having sufficient energy to penetrate the oxide layer over the full window opening area of each of the openings in the polysilicon layer but not sufficient energy to penetrate the polysilicon layer. Consequently, an appropriate conductivity type base region is implanted through each of the windows in the polysilicon. These ions are then driven to form a base region for each of the cells having a given depth and a given width.

Thereafter, the oxide covering the windows in the polysilicon layer is etched to expose an annular window. In one embodiment, the oxide at the center of each cell is thicker than the surrounding oxide and the exposed oxide surface can be etched until the annular window reaches the silicon surface and the etch process then stopped, leaving a central oxide dot. In another embodiment, a photoresist dot is defined at the center of the cell on a uniform oxide layer and the exposed oxide is etched to the silicon surface, also leaving a central oxide dot. This annular window may then be employed as a window in a subsequent implant or other diffusion step for diffusing a shallow source region into the surface of the base. The source region penetrates less far laterally under the polysilicon than the base, thus defining the device channel which can be inverted by a gate signal in order to operate the MOSFET device. A dielectric layer is then deposited and patterned to open contact windows to the source and base regions of each cell.

Note that the above-described process employs only three masks in forming the cell array. Therefore, a cell size of much smaller dimensions can be made.

As a further feature of the invention, it is also possible to employ an oxide region of increased thickness disposed within the center of the length of the polysilicon gate web. This region can be thicker where the polysilicon gate overlaps the N-drauin region than the oxide over the channel region. This feature simultaneously achieves the low threshold and high transconductance of thin gate dielectrics and the lower parasitic gate-to-drain capacitance of thick dielectrics. Since the gate-to-drain capacitance is a determining factor in switching speed for many applications, this is a substantial advantage. Moreover, this thicker oxide region can be formed with the same mask step that defines the oxide dot in the center of each cell.

BRIEF DESCRIPTION OF THE DRAWINGS

FIG. 2 is a cross-sectional view of the cell structure employed in a prior art MOSFET.

FIG. 3 is a cross-sectional view of FIG. 1 taken across lines 3—3 in FIG. 1 an illustrates the novel geometry of the base region of each of the cells in accordance with the invention.

FIG. 4 is a cross-sectional view similar to FIG. 3 and shows a further embodiment of the present invention employing an increased conductivity region at the center of each of the cells and an increased conductivity web region surrounding the outer periphery of each of the cells.

FIG. 5 shows a cross-section of the full width of a single MOSFET wafer in a first step in a manufacturing process.

FIG. 6 shows the device of FIG. 5 after the field oxide has been stripped from the active areas in preparation for the formation of individual cells which will define the power MOSFET device of the invention.

FIG. 7 is an enlarged view of a small portion of the active area of FIG. 6 and shows the formation of novel oxide dots which will be located at the center of each of the base regions which are formed.

FIG. 8 shows a step in the process following that of FIG. 7 wherein a gate oxide is deposited over the upper surface of the device of FIG. 7 and a polysilicon layer is deposited over the upper surface of the gate oxide.

FIG. 9 shows the step in the manufacture following that of FIG. 8, wherein the polysilicon is patterned to have an array of hexagonally shaped openings therein.

FIG. 10 shows the step in the manufacturing process following that of FIG. 9, wherein a base region is diffused through the windows in the polysilicon, the oxide at the bottom of the window is removed in an annular area, and an annular source is formed within the base region.

DETAILED DESCRIPTION OF THE DRAWINGS

Figure 1:
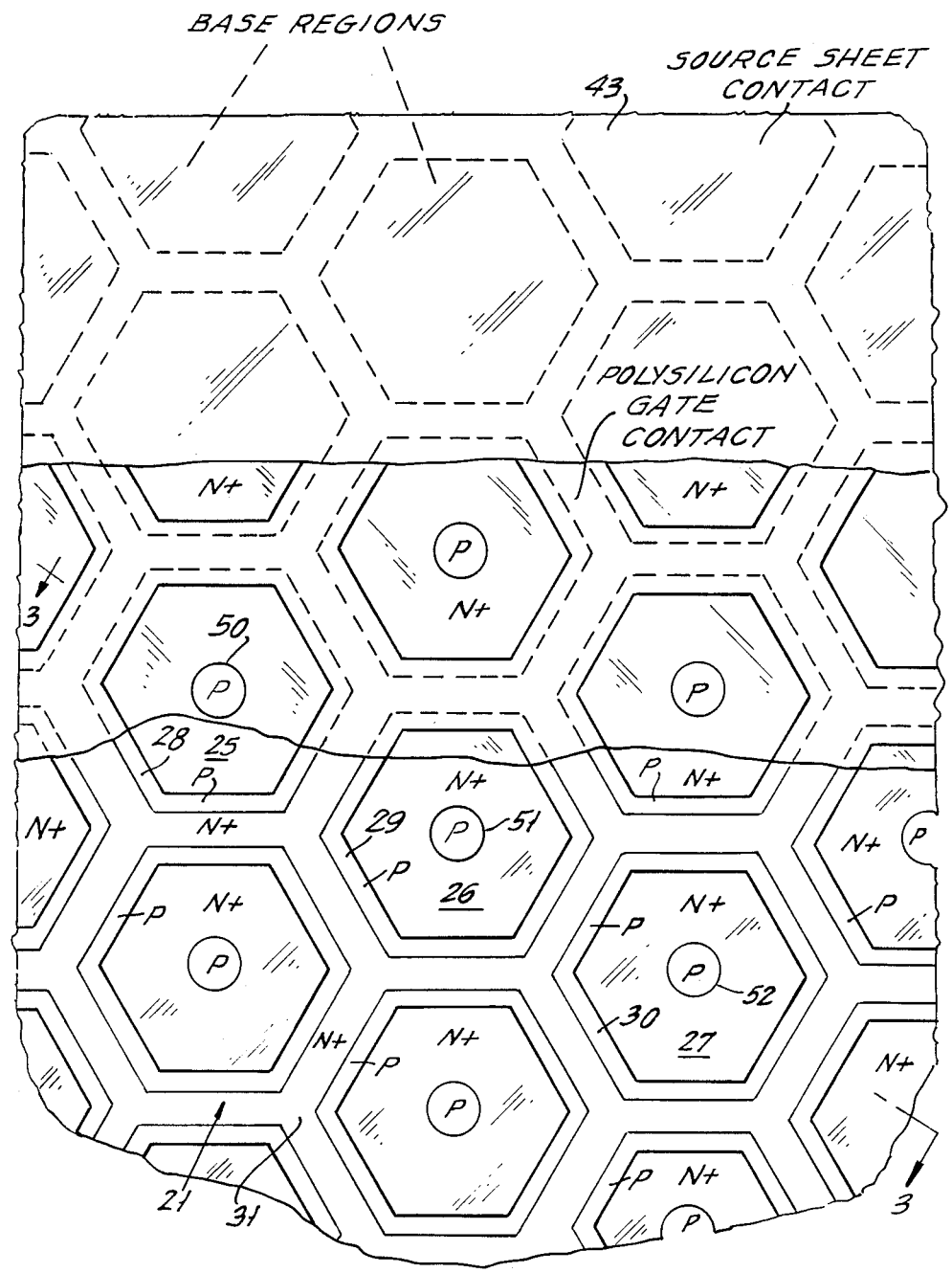
FIG. 1 is a top view of a portion of the active area of a MOSFET device constructed in accordance with the invention, wherein the source sheet contact and polysilicon gate contact are partly broken away.

Referring first to FIG. 2, there is shown therein a typical arrangement for the active area of a device having hexagonal source cells, as shown in co-pending application Ser. No. 243,544. It will be noted that throughout the specification the example of the invention is described in connection with a hexagonal configuration. The present invention, however, is applicable to any desired geometry for the cell configuration.

In FIG. 2, a small section of the active cell region is shown and is formed in a semiconductor wafer or chip 20 (which terms are used interchangeably herein) which consists of a relatively highly conductive N+ body region having a thin epitaxial, low conductivity N− region 21 thereon. A plurality of hexagonally shaped P+ base regions 22, 23 and 24 are formed in chip 20 and have respective annular source regions 25, 26 and 27 therein which define hexagonal channels 28, 29 and 30, respectively.

Each of the channels leads to an outer common hexagonal grid-type region formed in the epitaxial layer 21 shown as the common N+ region 31. The conductivity of region 31 is substantially higher than that of the underlying body of layer 21. Region 31 substantially reduces the on-resistance of the device by reducing spreading resistance and bulk resistance and further acts to tend to prevent the turn-on of the parasitic bipolar transistor formed, for example, by regions 26, 23 and 31 which would turn on more readily if N+ region 31 is of higher resistivity.

As further shown in FIG. 2, a gate oxide layer 40 is provided with a polysilicon conductive gate layer 41 overlying gate oxide 40. The polysilicon conductive gate electrode 41 is a hexagonal mesh which overlaps the channel regions such as channels 28, 29 and 30. The gate oxide 40 is of sufficient thickness as to produce the most desirable results in inverting the channel regions 28, 29 and 30 upon the application or removal of a voltage from the hexagonal grid gate 41.

The gate 41 is covered by an insulation layer 42, which may be silox, which is a phosphorus-doped silicon dioxide which forms a glassy passivation covering over the gate structure. A source contact 43, which is a single sheet of aluminum or any other desired contact metal, then covers the entire active surface area and makes low resistance contact to the interior surface regions of bases 22, 23 and 24 and to the source rings 25, 26 and 27. A drain electrode 44 is connected to the bottom of wafer 20.

In the above structure of FIG. 2, base regions 22, 23 and 24 are heavily doped and, therefore, are relatively highly conductive. Since they are heavily doped and formed at an earlier stage of the process, they diffuse more deeply, resulting in the increased depth regions 55, 56 and 57 shown in FIG. 2 which lead to shallower annular shelves 58, 59 and 60, respectively. Typically, the regions 55, 56 and 57 had a depth of 5 microns and the shelf regions 58, 59 and 60 had a depth of about 3 microns.

The device ruggedness was improved by the use of P+ material for the base regions 22, 23 and 24. This resistance is preferably low to reduce the effect of the parasitic bipolar device which is inherently created in the device geometry, for example, in layers 22, 31 and 23. Thus, if the resistance of the region beneath the sources 25, 26 and 27 is too high, a greater voltage drop is produced by injected carriers within the P type base which will forward-bias the first junction to cause more injection. By making this resistance as low as possible, the ruggedness of the device is increased but the increased depth regions 55, 56 and 57 are formed.

It is preferred, for minimum on-resistance and maximum transconductance of the MOSFET device, that the channel regions 28, 29, 30 be as lightly doped and as short as possible.

In accordance with the present invention and as is shown in FIGS. 1 and 3, it was found that by eliminating the increased depth regions 55, 56 and 57 for the individual base regions, advantages were produced which made it unnecessary to employ the higher conductivity material for the base regions. For instance, the elimination of the increased depth region produced the advantage of eliminating a deep diffusion and a mask from the manufacturing process, which enabled the use of a much smaller cell. The smaller cell was found to have just as low a resistance in the region beneath the sources by virtue of the decreased length of the resistive path, as compared to the larger cell. In addition, this resistance can be much lower than that of the larger cell by using the shallow P+ diffusion, as will be described later.

A further advantage of the present invention includes a much higher packing density, thus lowering the on-resistance per unit area figure of merit. In addition, the deeply diffused region of the larger cell was causing premature junction curvature-induced breakdown, resulting in a breakdown voltage much further below the theoretical limit. Thus, for a given epitaxial layer resistivity and thickness, the smaller cell was found to have as much as 50 volts higher breakdown. Equivalently, for the same breakdown voltage, an epitaxial layer of decreased resistivity and thickness could be used, resulting in lower on-resistance.

FIG. 3 is a cross-sectional view of FIG. 1 and is a first embodiment of the invention in which the increased depth regions 55, 56 and 57 have been eliminated. In FIGS. 1 and 3, all of the parts of the active regions which are similar to those of FIG. 2 have been given similar identifying numerals. FIGS. 1 and 3 show a device which employs a P type base and is an N channel enhancement mode device. Clearly, however, the invention described herein could apply equally to a device employing an N type base region and the invention could apply to enhancement or depletion mode devices.

The structure of FIGS. 1 and 3 differs from that of FIG. 2 in that the base regions 22, 23 and 24 are of P type rather than P+ type conductivity, and in that the P type regions 22, 23 and 24 are relatively shallow regions which have continuous bottom surfaces free of deep central regions. Also, N+ region 31 is not shown in FIG. 3. More particularly, in FIG. 3, the base region is of P type conductivity and has a sheet resistance of preferably about 300 ohms per square and in the range of 100 to 700 ohms per square as compared to the sheet resistance of about 150 ohms per square for the P+ regions of FIG. 2.

The depth of the P regions 22, 23 and 24 in FIG. 3 is preferably 3 microns (and in a range from 1 to 6 microns) as compared to the 5 micron depth of regions 55, 56 and 57 in FIG. 2.

Another difference in the structure of FIG. 3 from that of FIG. 2 is the employment of a thickened oxide region 70 in the gate oxide layer 40. Region 70 can have a central thickness, for example, of about 3,000 Angstroms and within a range of 2,000 to 5,000 Angstroms, while the outer shelf areas of oxide 40 which overlie the channels 28, 29 and 30 may be about 1,000 Angstroms thick. The gate oxide thickness in FIG. 2 is 1,000 Angstroms. The use of the thicker oxide over the drain region is advantageous since it reduces the gate-to-drain capacitance of the device and thus makes the device easier to turn off since a smaller energy is stored in the smaller gate capacitance.

A significant advantage of using the shallow, flat-bottomed base regions 22, 23 and 24 is that it eliminates the mask which was required in order to produce the deeper regions 55, 56 and 57 in FIG. 2. Elimination of a mask and a deep diffusion from the manufacturing process has the advantage of reducing the tolerance build-up produced by plural masks which, in turn, limits the smallest cell size which can be accurately produced. The smaller the cell size, the higher the packing density of cells within a given area, and thus the greater the effective channel width. By eliminating the mask needed to make the increased depth regions 55, 56 and 57 in FIG. 2, cell size was reduced from approximately 38 microns to approximately 26 microns. This reduction in size allows an approximate doubling of the number of cells used in a given area, thereby substantially improving the packing factor and channel width of the device.

In addition to increased packing, the use of the flat-bottom base regions produces an increase in the breakdown voltage of the device of approximately 15%. Thus, for a particular device which had a breakdown voltage of 440 volts, when the frame geometry was changed as shown in FIG. 2, the breakdown voltage was increased by about 15% to 490 volts. Thus, it became possible to use a lower resistivity and thinner epitaxial layer 21 for the basic wafer, as described previously.

FIG. 4 shows a further embodiment of the present invention in which elements similar to those of FIGS. 1, 2 and 3 have similar identifying numerals. FIG. 4 shows the N+ region 31 in the common region leading to the drain contact 44.

In FIG. 4, there is also shown a novel P+ region applied to the center of each of the P type base regions which extends to the upper surface of the device. Thus, in FIG. 4, P+ dots or regions 80, 81 and 82 are formed in the center of P type base regions 22, 23 and 24, respectively. These regions 80, 81 and 82 can be formed by an implant step as will be later described. Preferably, the P+ regions 80, 81 and 82 are deeper than and spread under the adjacent source regions 25, 26 and 27, respectively. Regions 80, 81 and 82 substantially reduce the resistance of the current path from the center top of each of the P+ frames, through the base region beneath the annular sources, to the N− region 21. By reducing the resistance of this path, it becomes more difficult to turn on the parasitic bipolar transistor which could inject a destructive current and energetic electrons into the gate region which could destroy the device. Thus, the device is made more "rugged".

When the P+ regions 80, 81 and 82 are formed by an implant and drive operation, atoms such as boron are implanted to a concentration of about $3 \times 10^{14} - 1 \times 10^{15}$ atoms per square centimeter. The N+ region of the source, however, is about $5 \times 10^{15} - 3 \times 10^{16}$ atoms per square centimeter so that the implanted boron dose will not overwhelm the N+ conductivity of the source regions.

In addition to substantially reducing the resistance beneath the source regions, to the P+ dots 80, 81 and 82 substantially reduce the contact resistance of the connection of the base to the aluminum sheet contact 43. Thus, it was found that the contact resistance was reduced tenfold when using the P+ dots 80, 81 and 82. In addition, the resistance of the current path through each base beneath each respective source, such as source 26 in FIG. 4, was reduced about tenfold and from about 1,200 ohms per square to about 150 ohms per square. This reduced resistance path substantially aids in suppressing the operation of the parasitic bipolar transistor formed between adjacent bases. In addition, this can be done without affecting the length or conductivity in the channel.

FIGS. 5 to 10 show the steps of a manufacturing process which can be employed to manufacture the device shown in FIG. 3.

Referring first to FIG. 5, there is shown therein a section of a larger wafer which is employed for the manufacture of a large number of N channel, depletion type devices. A large number of devices are formed in the single wafer and each is simultaneously processed on the single wafer.

The wafer to be used in accordance with the invention may have an N+ substrate 20 having a thickness of about 14 mils with an epitaxial layer 21 deposited thereon having a thickness and resistivity depending upon the desired reverse voltage of the device. Typically, the epitaxial layer 21 may have a thickness of about 35 microns and a resistivity of about 12 ohm centimeters to achieve 450 volt breakdown. By comparison, when using the deeper frame of FIG. 2, layer 21 had a thickness of 40 microns and a resistivity of about 14 ohm centimeters for the same breakdown voltage. After full processing, individual devices or chips are cut from the wafer along the notched regions 110 and 111, schematically shown in FIGS. 5 and 6, which are the walls of a notch of rectangular section.

The initial steps of the manufacturing process include the formation of outer guard rings and the like and may be the same as those disclosed in the above-noted co-pending application Ser. No. 178,689. Thus, as shown in FIG. 5, a field oxide 112 is first formed over the full surface of the wafer. Field oxide 112 is then photolithographically masked and etched and P+ guard rings 113 and 114 of conventional nature are formed in the outer periphery of the device.

Thereafter, the field oxide is stripped from the central active area of the device in which the large number of identical, parallel-connected field effect transistor cells are to be formed. FIG. 6 shows the surface 115 of the wafer 20 with the oxide 112 stripped therefrom.

The forming of the guard rings 113 and 114 in FIG. 5 and the removal or stripping of the field oxide in FIG. 6 require two masks. These, however, do not contribute to tolerance build-up problems in the formation of the individual cells in the active area.

In order to form the cell pattern in the active area, and as shown in greatly enlarged detail in FIG. 7 for the case of a single cell, the first step of the process employs the growth of a layer of silicon dioxide on the surface 115 to a thickness of about 3,000 Angstroms.

Thereafter, through a suitable photolithography step, the oxide layer is etched to leave a symmetric dot pattern, including dots 116, 117 and 118 in FIG. 7, distributed over the surface of the device. Each of these dots will be disposed in the center of a respective base region and, for example, dots 116, 117 and 118 are disposed in exact alignment with the P type circular areas 50, 51 and 52 of FIGS. 1 and 3. The oxide dots 116, 117 and 118 are used to permit these P type regions 50, 51 and 52 to reach the surface of the chip, as will be later described.

Following the formation of the oxide dots 116, 117 and 118, a gate oxide layer 120 is formed over the entire wafer surface, as shown in FIG. 8. FIG. 8 shows the dot 117 of FIG. 7 in an expanded view of the surface of FIG. 7. The gate oxide layer 120 overlies the dots such as dot 117 and has a thickness of about 1,000 Angstroms.

A layer of polysilicon 121 is then applied over the entire surface of oxide layer 120. The upper surface of the polysilicon layer 121 is then photolithographically masked and a plurality of polygonal, and preferably hexagonal, openings are formed in the mask. These openings define the outer periphery of each of the P type base regions which are subsequently to be formed.

Thereafter, the polysilicon is etched by an etchant which will etch the polysilicon exposed through the mask windows but will no etch the underlying oxide 120. This step creates the pattern shown in FIG. 9 for each of the cells wherein there is a gate oxide 120 exposed through the window 122 formed in the polysilicon layer 121.

Window 122 may have a width of about 14 microns between the parallel sides of a hexagonal shape. This width can be accurately held because only three masks are necessary in the procedure so that build-up of plural mask tolerances and deep diffusion tolerance does not interfere with the accurate reproduction of the cell sizes discussed herein. Note that oxide 120 has an increased thickened region at the center of the window 122 caused byy the underlying oxide dot 117. Note further that the polysilicon layer 121 will have a pattern of a hexagonal grid.

The polysilicon layer 121 then acts as a mask in a novel step for formation of the base and source regions. Thus, following the step of FIG. 9, an ion implant step is carried out in which ions, which will produce P type conductivity, such as boron, are implanted through the window 122 in the polysilicon layer 121. An accelerating voltage is chosen which enables the boron ions to penetrate the gate oxide 120, including the thickened region 117 but which is insufficient to cause the ions to penetrate the polysilicon layer 121. For example, with the oxide thicknesses and polysilicon thicknesses given above, boron atoms can be implanted with an accelerating voltage of about 80 kV. at a dose of about $1 \times 10^{14}$ ions/cm$^2$. Other ions can be implanted with any desired but appropriate accelerating voltage and dose.

The boron implant is followed by a heating drive to drive the boron impurity atoms into the body of the chip to form the P regions 22, 23 and 24, as shown in FIG. 10. A typical drive operation consists of heating the wafer for about 60 minutes at 1,200° in order to produce a depth for regions 22, 23 and 24 of about 3 microns.

Following the implant operation, the entire wafer or chip is exposed to an oxide etch operation which etches the exposed gate oxide layer 120, using the polysilicon layer 121 as a mask so that the oxide underlying the polysilicon layer 121 is not etched. Preferably, the oxide underlying polysilicon web 121 will have a thickness at this step of the process of about 3,000 Angstroms over the drain and 1,000 Angstroms over the channel as in FIG. 3.

The etching operation is stopped as soon as the exposed oxide 120 is fully etched down to the surface 115 of the silicon but where the thickness of oxide dot 117 is not yet etched. At this point the etch is stopped and the oxide dot 117 remains in place. Any conventional etch process can be employed. For example, for the oxide thickness described, buffered oxide etch 6:1 hydrofluoric acid can be used with the wafer immersed therein for 90 seconds.

Thereafter, a conventional diffusion operation is carried out, employing the polysilicon layer 121 as an outer mask and the oxide dot 117 as an inner mask for the formation of the annular N+ source region 26. Since the oxide dot 117 is in place, the N type dopant will not penetrate the center of the P type base 23. Therefore, the center of the P type base will extend to the upper surface 115 of the wafer.

The diffusion operation for forming the sources such as source 26 may include pre-deposition of POCl$_3$ which is appropriately driven until the source has a depth of about one micron.

Following the formation of the source 26 of FIG. 10, the surface 115 is cleaned and the oxide dots, including dot 117, are removed. The surface 115 then receives a silox layer which is a phosphorus-doped silicon dioxide which forms a glassy covering over the entire wafer surface. This upper surface is then masked and etched in order to form the silox covering 42 shown in FIG. 3 which seals around and insulates the gate 41 and the underlying gate oxide 40.

Thereafter, the upper surface of the device is metallized with an aluminum sheet electrode 43 and the lower surface receives the drain electrode 44. The entire device can then be further processed in order to expose the necessary connection regions for making electrical connection to the source and gate electrodes and for applying a further protective coating over the entire upper surface of the device.

Because of the novel process of the invention, wherein a first mask is eliminated because of the elimination of the need for deeper regions 55, 56 and 57 in the base regions, and because of the novel process shown in FIG. 9, whereby a single mask step permits the production of the shallow base 23 and the annular source 26 in which the base region extends to the surface at the center of the base, it is possible to make the base regions of very small size, thus increasing the cell packing factor for a given area device.

As further disclosed in FIG. 3, the gate oxide lattice can have an increased thickness region 70 at its center. This increased thickness region 70 can be formed during the processing steps described above, whereby, in addition to the formation of the oxide dots 116, 117 and 118 in the mask step of FIG. 7, a hexagonal lattice is also formed which underlies the polysilicon web 121 of FIG. 9.

Turning next to FIG. 4, it was described previously that it is desirable to employ an N+ region 31 beneath the gate oxide and adjacent the edges of the channels formed around the outside of each of the base regions. N+ region 31 can be formed in an early process step as disclosed in co-pending application Ser. No. 178,689. Thus, the N+ implant can be applied over the full surface of the wafer in FIG. 5 before any of the further processing steps.

As is further shown in FIG. 4, it is desired to employ P+ regions 80, 81 and 82 at the center of each of the bases. These P+ regions can be formed by means of an implant and drive of a P type impurity, just before the metallizing step in which the device of FIG. 10 is metallized, and following the etching of the silox layer 42 which can serve as a mask to the P+ implant and drive step.

Although the present invention has been described in connection with a plurality of preferred embodiments thereof, many variations and modifications will now become apparent to those skilled in the art. It is preferred, therefore, that the present invention be limited not by the specific disclosure herein, but only by the appended claims.

What is claimed is:

1. In a high power metal oxide semiconductor field effect transistor device comprising:
    a semiconductor chip having first and second parallel opposite surfaces;
    an upper layer on said chip of a relatively low conductivity region of one of the conductivity types extending to said first surface;
    a plurality of substantially identical polygonal base regions of the other of said conductivity types extending from said first surface into said upper layer, said plurality of base regions being symmetrically laterally disposed over said first surface and having peripheries which are spaced from peripheries of adjacent base regions by a given distance;
    a respective generally annular source region extending from said first surface into each of said base regions;
    the lateral outer periphery of each of said source regions being laterally spaced along said first semiconductor surface from the lateral outer periphery of its said respective base region, thereby to define respective channels of the opposite conductivity type which can be inverted;
    a gate oxide extending over each of said channels and a gate electrode atop said gate oxide; and
    source electrode means connected to each of said source regions and to respective adjoining portions of their associated base regions at respective contact areas;
    the improvement comprising, in combination with the foregoing:
    said polygonal base regions each having a depth of less than about 0.25 mil, having a flat bottom portion substantially coextensive with the area of said base region at said first surface, and being free of any further portion extending deeper than said flat bottom portion;
    a central region of each of said base regions having a lower extent situated above its associated flat bottom portion and an upper extent coextensive with said first surface and being in contact with said source electrode means, said central region having an increased conductivity compared to that of the remainder of said base region, said central region being deeper than its associated source region and extending laterally at least coextensively with the associated source electrode contact area;
    said central region extending laterally beneath at least a portion of its said source region, thereby to reduce the lateral electrical resistance of the source region beneath at least a portion of the lateral extent of said source.

2. The device of claim 1, wherein said base regions have a hexagonal periphery.

3. The device of claim 1, wherein the space between the outer peripheries of said base regions and for a given depth below said first surface has a conductivity substantially greater than that of said upper layer of relatively low conductivity region.

4. The device of claim 3, wherein said base regions have a hexagonal periphery.

5. The device of claim 3 which further includes a drain electrode connected to said second surface.

6. The device of claim 1 which further includes a drain electrode connected to said second surface.

7. The device of claim 1, wherein the spacing between the lateral centers of adjacent ones of said base regions define a cell repeat distance, said cell repeat distance being less than about 26 microns.

8. The device of claim 1, wherein said base region extends into said semiconductor chip for a depth substantially less than 5 microns.

9. The device of claim 1, wherein said base region extends into said semiconductor chip for a depth of about 3 microns.

* * * * *

UNITED STATES PATENT AND TRADEMARK OFFICE
CERTIFICATE OF CORRECTION

PATENT NO. : 4,974,059
DATED : November 27, 1990
INVENTOR(S) : Kinzer

It is certified that error appears in the above-identified patent and that said Letters Patent is hereby corrected as shown below:

Claim 1, Column 12, line 29, change "source" to --base--.

Signed and Sealed this

Twenty-third Day of February, 1999

Attest:

Q. TODD DICKINSON

*Attesting Officer*   *Acting Commissioner of Patents and Trademarks*